United States Patent
Hosoma et al.

(10) Patent No.: US 6,198,159 B1
(45) Date of Patent: *Mar. 6, 2001

(54) BONDED WAFER, PROCESS FOR PRODUCING SAME AND SUBSTRATE

(75) Inventors: Toshinori Hosoma; Kazuhiko Yosioka; Shouzou Katsuki, all of Ube (JP)

(73) Assignee: Ube Industries, Ltd., Ube (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/042,697

(22) Filed: Mar. 17, 1998

(30) Foreign Application Priority Data

Mar. 28, 1997 (JP) .................................. 9-078571

(51) Int. Cl.[7] .................................... H01L 23/58
(52) U.S. Cl. ................. 257/643; 257/347; 257/642
(58) Field of Search ................. 257/49, 288, 347, 257/506, 792, 642, 643

(56) References Cited

U.S. PATENT DOCUMENTS

| | | | |
|---|---|---|---|
| 3,759,913 | * | 9/1973 | Blackley ................ 524/348 |
| 4,523,976 | * | 6/1985 | Bukhman ................ 438/671 |
| 4,561,726 | * | 12/1985 | Goodby et al. ................ 349/135 |
| 4,596,069 | * | 6/1986 | Bayraktaroglu ................ 438/380 |
| 4,713,438 | * | 12/1987 | Harris et al. ................ 528/337 |
| 4,931,531 | * | 6/1990 | Tamai et al. ................ 528/172 |
| 4,978,379 | | 12/1990 | Sawada et al. ................ 65/18.2 |
| 4,978,712 | * | 12/1990 | Bair et al. ................ 525/51 |
| 5,077,244 | * | 12/1991 | Iyori et al. ................ 501/96 |
| 5,236,118 | * | 8/1993 | Bower et al. ................ 228/193 |
| 5,502,143 | * | 3/1996 | Oie et al. ................ 528/12 |
| 5,691,876 | * | 11/1997 | Chen et al. ................ 112/475.01 |

FOREIGN PATENT DOCUMENTS

| | | |
|---|---|---|
| 56-36136 | 4/1981 | (JP) . |
| 4-132258 | 5/1992 | (JP) . |
| 6-18234 | 3/1994 | (JP) . |

OTHER PUBLICATIONS

Kakao, Relationship Between Bond Strength and Crystallinity of High Polymers—Polyethylene, Polyethyleneterephthalate, and Nylon, 1971, Recent Advances in Adhesion, Gorden and Breach Science Pulishers: New York, p. 453–457, TP 967 .A56 1971.*

* cited by examiner

Primary Examiner—Carl Whitehead, Jr.
Assistant Examiner—Jeff Vockrodt
(74) Attorney, Agent, or Firm—Finnegan, Henderson, Farabow, Garrett & Dunner, L.L.P.

(57) ABSTRACT

A bonded wafer in which silicon wafers and an amorphous heat fusion bonding polyimide are used, a process for producing the same, and a substrate which is prepared by variously processing the bonded wafer.

11 Claims, 1 Drawing Sheet

BONDED WAFER, PROCESS FOR PRODUCING SAME AND SUBSTRATE

BACKGROUND OF THE INVENTION

1. Field of the Invention

The present invention relates to a bonded wafer in which a polyimide is used as a joining agent, a process for producing the same, and a substrate using the same.

2. Description of the Related Art

Direct bonding, electrostatic joining, soot glass joining, etc. have been proposed as methods for producing a bonded wafer.

All these methods require a joining temperature exceeding 1,000° C., and a joining time of several to several tens of hours.

Furthermore, all these methods require a production apparatus on a large scale, namely a heat treatment furnace to a diffusion furnace specification.

On the other hand, although an aromatic polyimide film is excellent in heat resistance, mechanical strength, electrical properties, etc., it shows poor adhesion to glass as is evident from the production of the film by casting on a glass support. The aromatic polyimide film has been considered inappropriate as a joining agent for the wafers.

SUMMARY OF THE INVENTION

An object of the present invention is to provide a bonded wafer in which a polyimide is used as a joining agent and the polyimide and wafers are joined together under relatively mild conditions and with uniformity, a process for producing the same, and a substrate derived from the same.

That is, the present invention relates to a bonding wafer comprising at least two wafer layers and a joining agent which joins the wafer layers together, the joining agent being an amorphous, heat fusion bonding aromatic polyimide (X) layer alone or a heat fusion bonding aromatic polyimide material comprising a substrate polyimide (Y) layer and an amorphous, heat fusion bonding aromatic polyimide (X) layer on each side of the substrate polyimide (Y) layer.

The present invention also relates to a process for producing a bonded wafer comprising the steps of sandwiching, as a joining agent, an amorphous, heat fusion bonding aromatic polyimide (X) layer alone or a heat fusion bonding aromatic polyimide film comprising a substrate polyimide (Y) layer and an amorphous, heat fusion bonding aromatic polyimide (X) layer on each side of the substrate polyimide layer, between at least two wafer layers, and joining the wafer layers together at a temperature of from the glass transition temperature of the aromatic polyimide (X) to the deterioration temperature thereof under a pressure of 0.1 to 100 kg/cm$^2$, or a process for producing a bonding wafer comprising the steps of coating one side of a wafer with a solution of a polyamic acid for forming an amorphous, heat fusion bonding aromatic polyimide (X) as a joining agent, heating the coated solution for the purpose of removing the solvent and causing imidation to form a heat fusion bonding aromatic polyimide layer, stacking another wafer on the wafer, and joining the wafer layers together at a temperature of from the glass transition temperature of the aromatic polyimide (X) to the deterioration temperature thereof under a pressure of 0.1 to 100 kg/cm$^2$.

Furthermore, the present invention relates to a substrate prepared by subjecting one surface of a bonded wafer to at least one processing selected from grinding, polishing and etching or a substrate prepared by removing one surface of a bonded wafer so that the wafer has a SOI structure, the bonded wafer comprising at least two wafer layers and a joining agent which joins the wafer layers together, the joining agent being an amorphous, heat fusion bonding aromatic polyimide (X) layer alone or a heat fusion bonding aromatic polyimide material comprising a substrate polyimide (Y) layer and an amorphous, heat fusion bonding aromatic polyimide (X) layer on each side of the substrate polyimide (Y) layer.

DESCRIPTION OF THE PREFERRED EMBODIMENTS

There is no specific limitation on the wafers used in the present invention, and commercially available wafers having a thickness and a diameter which are freely selected can be used. Examples of the wafers 2 and 4 shown in FIG. 1 include silicon wafers, GaAs wafers and various single crystal substrates. Of these wafers, silicon wafers are particularly suitably used.

Since bonding at a low temperature is possible in the present invention, use of wafers in which circuits are formed in advance results in no substantial diffusion of impurities caused by bonding and in stabilization of the circuit characteristics, namely achieving the effect that damage is decreased.

It is necessary in the present invention to use, as the joining agent, an amorphous, heat fusion bonding aromatic polyimide (X) layer alone or a heat fusion bonding aromatic polyimide material in which an amorphous, heat fusion bonding aromatic polyimide (X) layer is provided on each side of a substrate polyimide (Y) layer. "Amorphous" herein signifies that the crystallinity determined by Rowland analysis of the X-ray diffraction spectrum can be substantially ignored, the crystallinity is suitably less than 5%, more suitably up to 3%, particularly suitably up to 1%. When a crystalline polyimide is used, joining wafers requires a high pressure, and the joined wafers tend to peeled apart. When a polyimide which is not heat fusion bonded is used, the bonded wafer thus obtained is readily peeled off. In both cases, a uniform bonded wafer is difficult to form.

Figure 1:
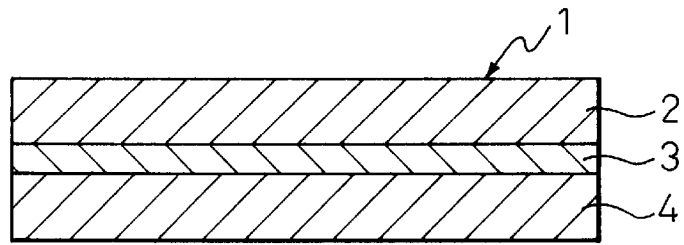
FIG. 1 is a schematic cross-sectional view showing one embodiment of a bonded wafer of the present invention.

Referring to FIG. 1, the bonded wafer 1 of the present invention can be obtained by a process comprising the steps of sandwiching, as a joining agent 3, an amorphous, heat fusion bonding aromatic polyimide (X) layer alone or a heat fusion bonding aromatic polyimide film comprising a substrate polyimide (Y) layer and an amorphous, heat fusion bonding aromatic polyimide (X) layer on both sides of the substrate polyimide layer, between at least two wafer layers 2 and 4, suitably degassing under reduced pressure (particularly in vacuum), and joining the wafer layers together at a temperature of from the glass transition temperature of the aromatic polyimide (X) to the deterioration temperature thereof, suitably at a temperature of 250 to 350° C., under a pressure of 0.1 to 100 kg/cm$^2$, suitably for a period of from 1 sec to 30 minutes.

Alternatively, the bonded wafer can be obtained by a process comprising the steps of coating one side of a wafer with a solution of a polyamic acid for forming an amorphous, heat fusion bonding aromatic polyimide (X) (a solution of a monomer mixture in which a half ester of an aromatic tetracarboxylic acid is used and in which polymerization with an aromatic diamine substantially does not take place may also be used) as a joining agent, heating the coated solution for the purpose of removing the solvent and causing imidation (polymerization of the polyamic acid being included) to form a heat fusion bonding aromatic polyimide layer, stacking another wafer on the wafer, suitably degassing under reduced pressure (particularly in vacuum), and joining the wafer layers together at a temperature of from the glass transition temperature of the aromatic polyimide (X) to the deterioration temperature thereof, suitably at a temperature of 250 to 350° C., under a pressure of 0.1 to 100 kg/cm$^2$, suitably for a period of from 1 sec to 30 minutes.

Particularly when a joining agent is formed by applying the solution of a polyamic acid for forming an amorphous, heat fusion bonding aromatic polyimide (X) as the joining agent, a bonded wafer or substrate free from voids is preferably obtained even if the initial wafers have grooves having been formed in advance, or steps or irregularities on the surface.

The substrate of the present invention can be obtained suitably by subjecting one surface of the bonded wafer of the present invention to at least one process selected from grinding, polishing and etching.

Figure 2:
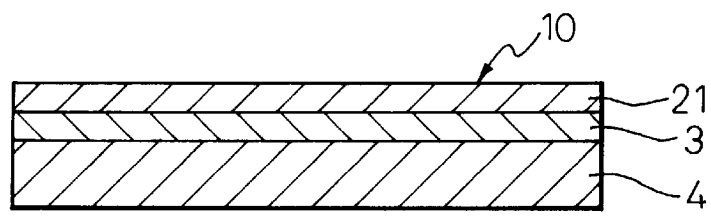
FIG. 2 is a schematic cross-sectional view showing one embodiment of a substrate having been subjected to a process of grinding and polishing.
Figure 3:
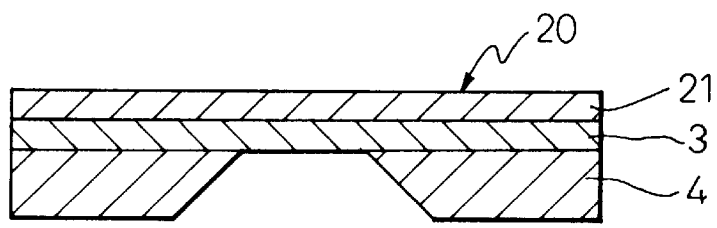
FIG. 3 is a schematic cross-sectional view showing one embodiment of a substrate in which a part of the non-processed surface of a thin bonding substrate of the present invention is etched.
Figure 4:
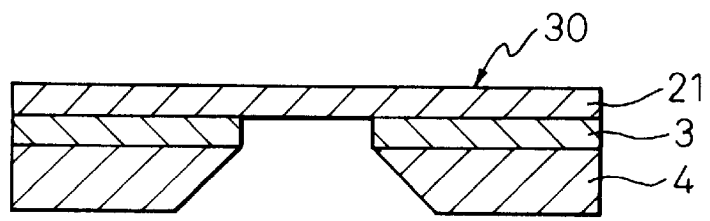
FIG. 4 is a schematic cross-sectional view showing one embodiment of a substrate in which a part of the polyimide film is removed from an etched substrate of the present invention.

An example of producing the substrate of the present invention will be explained with reference to figures. A bonded wafer 1 of the present invention shown in FIG. 1 is ground, and polished further suitably by mechanochemical polishing to form a thinned wafer 21 having a mirror surface and give a thinned substrate 10 shown in FIG. 2. Next, one of the two surfaces, suitably a part of the non-processed surface of the bonding substrate is masked and subjected to patterning or the like procedure. A part of the wafer is then etched to give an etched substrate 20 shown in FIG. 3. Next, a part of the polyimide film which is the joining agent is removed to give a processed substrate 30 shown in FIG. 4.

The substrate prior to or subsequent to the removal of the polyimide film can be subjected to a step of dicing not shown in the figures to give thin and small substrates.

In the present invention, removal of one surface of the bonded wafer in a predetermined amount as described above can give a substrate in which the wafer has a so-called SOI structure.

Furthermore, in the present invention, the thin and small substrates obtained as described above are provided with circuits to give substrates as elements.

It is satisfactory to provide the substrates with circuits which can be used in the application of the wafer at a temperature up to the heat-resistant temperature of the polyimide material (X), usually up to about 300° C.

Although 2,3,3',4'-biphenyltetracarboxylic dianhydrides are most preferred as tetracarboxylic dianhydrides (acids, acid dianhydrides, acid esters) which can be used for the polyimides (X) as joining agents in the present invention, 2,2-bis(3,4-dicarboxyphenyl)propane dianhydride, bis(3,4-dicarboxyphenyl) ether dianhydride, and acids and acid esters of these compounds may also be used. A part of these acids may be replaced with pyromellitic dianhydride, 3,3', 4,4'-benzophenonetetracarboxylic dianhydride and 3,3'4,4'-biphenyltetracarboxylic dianhydride.

In the present invention, 1,3-bis(4-aminophenoxy) benzene is most preferred as the diamine that can be used for the polyimide (X). Other aromatic diamines having a flexible structure such as diamines that have a plurality of benzene rings and a group of O, $CH_2$, S, $C(CH_3)_2$, O(Bz)O (Bz: benzene), (Bz)O(Bz), $SO_2$, or the like in the backbone chain of the molecule, and also having both amine groups at the meta-positions are suitably used. Examples of the aromatic diamines include 1,3-bis(3-aminophenoxy)benzene, 3,3'-diaminodiphenyl ether, 3,3'-diaminodiphenyl sulfide, 3,3'-diaminobenzophenone, 3,3'-diaminodiphenylmethane, 2,2-bis(3-aminophenyl)propane, 1,4-bis(3-aminophenoxy) benzene, 4,4'-bis(3-aminophenyl)diphenyl ether, 4,4'-bis(3-aminophenyl)diphenylsulfone, 4,4'-bis(3-aminophenyl) diphenyl sulfide, 4,4'-bis(3-aminophenyl)di-pehnylmethane, 4,4'-bis(3-aminophenoxy)diphenyl ether, 4,4'-bis(3-aminophenoxy)diphenylsulfone, 4,4'-bis(3-aminophenoxy) diphenyl sulfide, 4,4'-bis(3-aminophenoxy)diphenylmethane and 2,2-bis[3-(aminophenoxy)phenyl] propane.

In the present invention, the components mentioned above may be reacted in an organic solvent suitably under the condition that the tetracarboxylic dianhydride is present excessively or that the terminal amine groups are sealed with a dicarboxylic anhydride to give a solution of a polyamic acid which may be partly converted into an imide so long as a uniform solution state is maintained. Examples of a dicarboxylic anhydride for sealing the terminal amine groups of the polyimide (X) are phthalic anhydride and its substitution product, hexahydrophthalic anhydride and its substitution product, succinic anhydride and its substitution product, and the like, of these compounds, phthalic anhydride is particularly preferred.

In order to obtain the polyimide (X) in the present invention, it is preferred that the components be reacted in the organic solvent in the following proportion. The ratio of the amount of the diamine used (as number of moles in terms of amino groups) to the total moles of the acid anhydride (as total moles of the tetracarboxylic dianhydride and dicarboxylic anhydride in terms of acid anhydride groups) is preferably from 0.9 to 1.0, more preferably from 0.98 to 1.0, particularly preferably from 0.99 to 1.0. The mole ratio of the dicarboxylic anhydride used for sealing the terminal amine groups to the acid anhydride groups of the tetracarboxylic dianhydride is preferably up to 0.05, particularly preferably from 0.0001 to 0.02.

When the proportion of the diamine and the dicarboxylic anhydride mentioned above is outside the range mentioned above, the molecular weight of the polyamic acid, namely the polyimide (X) becomes small, and the peeling strength of the joining agent itself and the silicon wafers are lowered. Particularly, under the condition of an excessive diamine component, the polyamic acid may form a cyclic imide, or it may be deteriorated during the solvent removal. Consequently, the bonding wafers may show a lowered peeling strength.

A polyimide having an ηinh [0.5 g/dl in N-methyl-2-pyrrolidone (30° C.)] of at least 0.5, particularly 0.5 to 3 is preferred as the amorphous heat fusion bonding polyimide (X) in the present invention.

There is no specific limitation on the substrate polyimide (Y) in the present invention so long as it is a highly heat-resistant polyimide. Currently produced and marketed heat-resistant polyimide films can be used. In particular, the following polyimide can be used as the substrate polyimide (Y) due to its dimensional stability and high stiffness: a polyimide produced from 3,3',4,4'-biphenyltetracarboxylic dianhydride (sometimes abbreviated to s-BPDA hereinafter) and p-phenylenediamine (sometimes abbreviated to PPD hereinafter), and additionally from 4,4'-diaminodiphenyl ether (sometimes abbreviated to DADE hereinafter) in some cases. The molecular ratio of PPD/DADE is preferably from 100/0 to 70/30. Moreover, a polyimide prepared from pyromellitic dianhydride and 4,4'-diaminodiphenyl ether, and additionally from p-phenylenediamine in some cases can be used. The substrate polyimide (Y) can be synthesized by any of the following procedures so long as the proportion of the components is finally in the range as mentioned above: random polymerization, block polymerization, and synthesis of two types of polyamic acids in advance followed by mixing the two solutions of respective polyamic acids under the reaction conditions.

The components mentioned above can be used and approximately equimolar amounts of the diamine component and the tetracarboxylic dianhydride can be reacted in an organic solvent to form a solution of a polyamic acid (a part of the polyamic acid may be imidated so long as a uniform solution state is maintained).

Other types of aromatic tetracarboxylic dianhydrides or aromatic diamines, for example, 3,3',4,4'-benzophenonetetracarboxylic dianhydride or 4,4'-diaminodiphenylmethane, etc. may be used in such amounts that the physical properties of the polyimide (Y) are not impaired.

Examples of the organic solvent used in the production of the polyamic acid for both the polyimide (X) and the polyimide (Y) include N-methyl-2-pyrrolidone, N,N-dimethyl-formamide, N,N-dimethylacetamide, N,N-diethylacetamide, dimethyl sulfoxide, hexamethylphosphoramide, N-methyl-caprolactam and cresols. These organic solvents may be used singly or in a mixture of at least two of them.

The polyimide (X) in the present invention can be obtained in a film-like state by the following procedures: the aromatic tetracarboxylic acid component for forming an amorphous polyimide such as 2,3,3',4'-biphenyltetracarboxylic dianhydride and the aromatic diamine component for forming a heat fusion bonding polyimide such as 1,3-bis(4-aminophenoxy)benzene, and additional other tetracarboxylic dianhydride and other diamines in some cases are reacted in an organic solvent at a temperature of up to about 100° C., particularly at a temperature of 20 to 60° C. to form a solution of a polyamic acid; the solution of a polyamic acid is used as a dope solution, from which a film of the dope solution is formed; the film is simultaneously subjected to solvent removal and imide ring formation of the polyamic acid, or subjected to solvent removal by drying in the case where the solution is a solution of the polyimide. The imide ring formation can also be performed either by heating the solution of a polyamic acid produced as described above at a temperature of 150 to 250° C., or by adding an imide-forming agent, reacting at a temperature of up to 150° C., particularly at a temperature of 15 to 50° C. to form imide rings, and evaporating the solvent or precipitating the polyimide in a poor solvent to form powder.

When the multilayer polyimide film is to be used as the joining agent in the present invention, it is preferred that the multilayer polyimide film be produced, for example, by the following procedures: a solution of the polyamic acid for the substrate polyimide (Y) (transparent viscous solution) and a solution of the heat fusion bonding thin layer polyimide (X) or its precursor are co-extruded and cast on and applied to a support such as a stainless steel mirror surface or belt surface to become in a semi-hardened state or dried state prior to the semi-hardened state at a temperature of 100 to 200° C.

Treatment of the cast film at a temperature exceeding 200° C. tends to cause problems such as a decrease in the joining strength, in the production of the multilayer polyimide film.

The semi-hardened state or dried state prior thereto signifies that the cast and applied material is in a self-supporting state having partially gelled by heating and/or chemical imide formation, or in a self-supporting state in a stage immediately prior thereto.

When the multilayer polyimide film is used as a joining agent in the present invention, co-extrusion of the solution of the polyamic acid for forming the substrate polyimide (Y) and the solution of the polyamic acid or polyimide for forming the heat fusion bonding polyimide (X) can be conducted, for example, by the co-extrusion procedure disclosed in Japanese Unexamined Patent Publication (Kokai) No. 3-180343 wherein the solutions are fed to a die for extruding three layers, and they are cast on a support.

It is preferred that the multilayer extruded polyimide film of the present invention be produced by the following procedures: a solution of the polyamic acid or polyimide for forming the heat fusion bonding polyimide (X) is laminated to both surfaces of the extrudate layer for forming the substrate polyimide (Y) to form a multilayer film-like material and dried; the film-like material is dried, and subjected to imide formation by heating it to a temperature of from the glass transition temperature (Tg) of the polyimide (X) to the temperature at which the deterioration takes place, suitably at a temperature of up to 360° C., particularly suitably at a temperature of 310 to 360° C. (surface temperature measured by a surface thermometer) and suitably by heating at the temperature for 1 to 60 minutes.

When the multilayer polyimide film is used as a joining agent in the present invention, the film (layer) of the substrate polyimide (Y) preferably has a thickness of about 15 to 25 μm. When the thickness is less than 15 μm, the mechanical strength and dimensional stability of the multilayer polyimide film thus prepared can cause a problem. In this case, the heat fusion bonding polyimide (X) layer preferably has a thickness of 1 to 10 μm. When the thickness is less than 1 μm, the joining capability becomes insufficient. Even when the thickness exceeds 10 μm, no specific effects can be achieved though the heat fusion bonding polyimide film may be used. It is preferred that the film (layer) thickness of the substrate polyimide (Y) be at least 50% of the entire thickness of the multilayer film. When the proportion is less than 50%, the linear thermal expansion coefficient of the multilayer film thus prepared becomes large, and problems associated with the mechanical strength and dimensional stability arise.

When the multilayer polyimide film is used in the present invention, selection of a suitable combination of the substrate polyimide (Y) and the heat fusion bonding polyimide as mentioned above makes it possible to conduct curing at relatively low temperatures. Accordingly, imide formation and drying of the multilayer polyimide film can be completed without deteriorating the heat fusion bonding polyimide (X). As a result, the dimension stability of the polyimide layers becomes high, and the wafers can be joined together under mild conditions to give a bonding wafer and a substrate having a high peeling strength. Preferably, the peeling strength is at least 100 kgf/cm$^2$ especially at least 500 kgf/cm$^2$.

The bonding wafer and the substrate of the present invention can be suitably used as elements produced by a process conducted at temperature lower than the heat-resistant temperature of the polyimide.

For example, the substrate is useful for producing a sensor and a micro-machine.

The substrate can be used for a substrate in which an amplifying circuit such as a capacitor or a detecting circuit is incorporated.

The present invention will be further illustrated below with reference to examples and comparative examples.

REFERENCE EXAMPLE 1

1,3-Bis(4-aminophenoxy)benzene, triphenyl phosphate as a stabilizing agent and N-methyl-2-pyrrolidone as an organic solvent were placed in a reaction vessel, and 2,3,3',4'-biphenyltetracarboxylic dianhydride (1.01 mole per mole of the diamine) was added to the contents of the reaction vessel in a nitrogen stream. The resultant mixture was reacted at temperature up to 60° C. for 5 hours to give a pale brown transparent viscous solution of a polyamic acid (11% by weight) for forming an amorphous heat fusion bonding polyimide (X).

REFERENCE EXAMPLE 2

A starting material dope [prepared under the following conditions: 3,3',4,4'-biphenyltetracarboxylic dianhydride/p-phenylenediamine, a polyamic acid concentration of 18% by weight, N,N-dimethylacetamide used as an organic solvent, held at first at 50° C. and then at 25° C.] for a substrate polyimide (Y) and a starting material dope [prepared under the following conditions: a molecular ratio of 2,3,3',4'-biphenyltetracarboxylic dianhydride/1,3-bis(4-aminophenoxy)benzene of 1002:1000, a polyamic acid concentration of 22% by weight, N,N-dimethylacetamide used as an organic solvent, triphenyl phosphate added in an amount of 0.1% based on the monomers, held at 25° C.] for a heat fusion bonding polyimide (X) were cast on a metal support using a film-forming apparatus equipped with a die for extruding three layers. The cast materials were dried at 140° C., peeled off, and dried at temperature from 200 to 310° C. to give a three-layer extruded polyimide film having a thickness of 33 $\mu$m (structure of thickness: 4 $\mu$m/25 $\mu$m/4 $\mu$m).

In addition to the above film, a polyimide film was obtained from the solution of the polyamic acid for forming the polyimide (X) in same manner as mentioned above. The crystallinity index of the polyimide film was measured by X-ray diffraction (wide angle X-ray), determined by the Rowland method, and found to be 0%. The polyimide film had a glass transition temperature (Tg) of 250° C., and an $\eta$inh [0.5 g/dl in N-methyl-2-pyrrolidone (30° C.)] of 0.75.

EXAMPLE 1

The three-layer heat fusion bonding polyimide film 33 $\mu$m thick obtained in Reference Example 2 was sandwiched between two commercially available silicon wafers 4 inches in diameter (one wafer (N type) having a face index of [110], a resistivity of 2 to 6 $\Omega$cm, a thickness of 300±10 $\mu$m and two major mirror surfaces; and the other wafer (N type) having a face index of [110], a resistivity of 2 to 6 $\Omega$cm, a thickness of 300±10 $\mu$m and two major mirror surfaces), degassed in vacuum, heated to 300° C., and held at 300° C. under pressure of 50 kg/cm for 30 sec. The two silicon wafers were thus joined together with the polyimide. The bonded wafer thus obtained had no warp. The wafer was subjected to void inspection using an ultrasonic wave image inspection apparatus (manufactured by Hitachi Ltd.), and no void detectable by the void inspection was observed. The wafer showed a satisfactory peeling strength of 800 kgf/cm$^2$ when the peeling strength was measured by the Sebastian method.

EXAMPLE 2

A silicon wafer 4 inches in diameter (N type) having a face index of [110], a resistivity of 2 to 6 $\Omega$cm, a thickness of 300±10 $\mu$m and two major mirror surfaces was coated with the polyamic acid varnish having been obtained in Reference Example 1 on one side, and heat treated (maximum temperature of 320° C.) to give a polyimide (X)/silicon wafer laminate having a polyimide film thickness of 20 $\mu$m. A second silicon wafer (N type) having a face index of [110], a resistivity of 2 to 6 $\Omega$cm, a thickness of 300±10 $\mu$m and two major mirror surfaces was stacked on the polyimide (X)/silicon wafer laminate with one of the second wafer surface contacted with the polyimide film. The stacked layers were heated to 300° C., and a pressure of 50 kg/cm$^2$ was applied for 30 sec. The bonded wafer thus obtained had no warp. The wafer was subjected to void inspection with ultrasonic waves, and no void detectable by the void inspection was observed. The wafer showed a satisfactory peeling strength of 950 kgf/cm$^2$ when the peeling strength was measured by the Sebastian method.

EXAMPLES 3 to 4

The three-layer heat fusion bonding polyimide film (thickness of 33 $\mu$m) obtained in Reference Example 2 to be used as a polyimide was sandwiched between two commercially available silicon wafers (P type) 6 inches in diameter having a face index of [110], a thickness of 525±25 mm and a resistivity of 1 to 10 $\Omega$cm, vacuum degassed, heated to 300° C., and held at 300° C. under pressure of 0.2 kg/cm$^2$ (Example 3) or 1.0 kg/cm$^2$ (Example 4) for 30 sec, whereby the two silicon wafers were joined together with the polyimide. The bonded wafers thus obtained had no warp. The wafers were subjected to void inspection with ultrasonic waves, and no void detectable by the void inspection was observed. The wafers showed a satisfactory peeling strength.

EXAMPLE 5

One side of the bonded wafer (silicon wafers having a face index of [110]) obtained in Example 1 was ground with a grinding stone of 200 mesh, and polished by mechanochemical polishing to have a mirror surface. The polishing caused no problem such as peeling and chipping. The thinned wafer had a thickness of 20 $\mu$m. A part of the non-polished side of the bonded wafer thus obtained was masked, patterned, and anisotropically etched with an aqueous solution of potassium hydroxide, followed by removing the polyimide film used as a joining agent to give a substrate for a pressure sensor.

According to the present invention, a polyimide is used as a joining agent, and the polyimide and wafers are firmly joined together. As a result, a bonded wafer free from voids and having uniformity can be obtained.

Furthermore, according to the present invention, a polyimide is used as a joining agent, and the polyimide and wafers are joined together under relatively mild conditions to have a satisfactory peeling strength. As a result, a bonded wafer free from voids and having uniformity can be produced.

According to the present invention, a polyimide is used as a joining agent, and a substrate in which the polyimide and wafers are firmly bonded together and which have voids in a decreased amount and uniformity can be obtained.

What is claimed is:

1. A bonded wafer comprising at least two wafer layers and a joining agent which joins the wafer layers together, the joining agent being a polyimide film which is an amorphous, heat fusion bonding aromatic polyimide (X) layer alone or a heat fusion bonding aromatic polyimide material comprising a substrate polyimide (Y) layer and an amorphous, heat fusion bonding aromatic polyimide (S) layer on each side of the substrate polyimide (Y) layer, wherein the amorphous, heat fusion bonding aromatic polyimide (X) (a) is an amorphous, heat fusion bonding aromatic polyimide obtained from a polyamic acid, obtained by reacting (i) an aromatic tetracarboxylic acid component selected from the group consisting of aromatic tetracarbxylic acids, aromatic tetracarboxylic dianhydrides and aromatic tetracarboxylic acid esters with (ii) an aromatic diamine under the condition that the tetracarboxylic acid component is present excessively or that terminal groups of the aromatic diamine are sealed with a dicarboxylic anhydride, (b) has an η inh (0.5 g/dl in N-methyl-2-pyrrolidone (30° C.)) of 0.5 to 3, and (i) has a crystallinity of not higher than 1%, and wherein at least part of the polyimide film can be removed from the bonded waver, and the peeling strength of the wafer is at least 100 kgf/cm$^2$.

2. The bonded wafer according to claim 1, wherein the wafer layers are silicon wafers.

3. The bonded wafer according to claim 1, wherein the wafer layers have circuits formed in advance of the wafer layers being joined together.

4. The bonded wafer according to claim 1, wherein the wafer layers have grooves formed in advance of the wafer layers being joined together, or steps and irregularities on the surface, and the joining agent is an amorphous, heat fusion bonding aromatic polyimide (X) layer obtained by applying a coating of a solution of a polyamic acid, heating, and subjecting the coating to solvent removal and imidation.

5. The bonded wafer according to claim 1, wherein the heat fusion bonding aromatic polyimide material is an aromatic polyimide layer obtained from 2,3,3',4'-biphenyltetracarboxylic acid, the dianhydride of the acid or an ester of the acid and 1,3-bis(4-aminophenoxy)benzene.

6. A substrate prepared by subjecting one surface of the bonded wafer according to claim 1 to at least one process selected from grinding, polishing and etching.

7. The substrate according to claim 6, wherein the bonded wafer prepared by joining together the wafers on which circuits have been formed in advance of the wafers being joined together and is subjected to processing.

8. The substrate according to claim 6, which is prepared by reducing the thickness and size of the substrate and which is provided with circuits.

9. A substrate prepared by removing one surface of the bonded wafer according to claim 1 in a predetermined amount so that the wafer has a SOI structure.

10. The substrate according to claim 9, wherein the bonded wafer prepared by joining together the wafer layers on which circuits have been formed in advance of the wafer layers being joined together is subjected to processing.

11. The substrate according to claim 9, which is prepared by reducing the thickness and size of the substrate and which is provided with circuits.

\* \* \* \* \*

UNITED STATES PATENT AND TRADEMARK OFFICE
CERTIFICATE OF CORRECTION

PATENT NO.     : 6,198,159 B1
DATED          : March 6, 2001
INVENTOR(S)    : Toshinori Hosoma et al.

Page 1 of 1

It is certified that error appears in the above-identified patent and that said Letters Patent is hereby corrected as shown below:

<u>Column 9, claim 1,</u>
Line 26, "tetracarbxylic" should read -- tetracarboxylic --.
Line 35, "waver" should read -- wafer --.

Signed and Sealed this

Fifth Day of March, 2002

Attest:

Attesting Officer

JAMES E. ROGAN
Director of the United States Patent and Trademark Office